(12) United States Patent
Couture et al.

(10) Patent No.: US 6,982,176 B2
(45) Date of Patent: Jan. 3, 2006

(54) METHOD FOR MONITORING PRODUCTION OF PIXEL DETECTORS AND DETECTORS PRODUCED THEREBY

(75) Inventors: Aaron Judy Couture, Schenectady, NY (US); Douglas Albagli, Clifton Park, NY (US); George Edward Possin, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 96 days.

(21) Appl. No.: 10/696,881

(22) Filed: Oct. 30, 2003

(65) Prior Publication Data

US 2005/0092986 A1 May 5, 2005

(51) Int. Cl.
*H01L 21/66* (2006.01)
(52) U.S. Cl. .......................................... 438/14; 438/18
(58) Field of Classification Search ............... 438/5, 438/10, 11, 14, 17, 18
See application file for complete search history.

(56) References Cited

U.S. PATENT DOCUMENTS

| | | | |
|---|---|---|---|
| 5,233,181 A | 8/1993 | Kwansnick et al. | |
| 5,587,591 A | 12/1996 | Kingsley et al. | |
| 5,648,654 A | 7/1997 | Possin | |
| 5,777,355 A | 7/1998 | Possin et al. | |
| 6,465,824 B1 | 10/2002 | Kwansnick et al. | |
| 2003/0189175 A1 | 10/2003 | Lee et al. | |

FOREIGN PATENT DOCUMENTS

| | | |
|---|---|---|
| EP | 1 179 852 A2 | 2/2002 |
| EP | 1 179 852 A3 | 2/2002 |

*Primary Examiner*—Ha Nguyen
*Assistant Examiner*—Scott Geyer
(74) *Attorney, Agent, or Firm*—Fletcher Yoder

(57) ABSTRACT

A method for monitoring the quality of a manufacturing process for making detector panels that have a plurality of pixels in a two-dimensional array includes, in each detector panel, manufacturing a set of baseline pixels and a set of test pixels. Each test pixel has an electrical component having a geometric dimension varied by an amount sufficient to introduce a measurable variation in a test that measures parameters of pixels that are dependent upon the varied dimension. The method further includes performing the test on the set of baseline pixels and the set of varied pixels, analyzing the results of the test, and adjusting parameters of the manufacturing process in accordance with the analysis.

22 Claims, 4 Drawing Sheets

METHOD FOR MONITORING PRODUCTION OF PIXEL DETECTORS AND DETECTORS PRODUCED THEREBY

BACKGROUND OF THE INVENTION

This invention relates generally to methods for monitoring a semiconductor array production process and the arrays produced thereby, and more particularly to methods particularly suitable for monitoring and adjusting a manufacturing process for detector arrays that, while also more generally useful, is particularly suitable for monitoring production of flat panel x-ray detectors.

The performance of pixilated flat panel x-ray detectors (FP-XRD) is influenced by many different production parameters. Variations in performance due to film quality can appear spatially across a single panel, from panel-to-panel, and from lot-to-lot. Measurement of the amount of process variation is useful in controlling final performance variation during production of imaging panels, as is identifying the influence of the process on final device performance. If production yield drops, being able to quickly identify and improve the process step leading to the degradation would help reverse the drop in production yield.

At least one known procedure for controlling variability uses ex-situ monitoring of individual processes. For example, if the resistivity of a layer influences final performance, test films are grown on blank substrates and measured. Periodic growth of test films is used to monitor the quality of the process. However, ex-situ tests do not take into account interactions between process steps. For example, a later step may degrade the performance of a layer deposited in a previous step. At least one other known method of diagnosing problems includes fabricating a set of complete detectors in which a single or multiple process parameters are changed for each detector. The resulting performance of the detectors is then measured, and the sensitivity to process parameters determined. However, this method is inefficient in that it requires fabrication of a complete detector for each variation to be tested. Yet another known method includes fabricating individual test devices in a periphery of the panel, outside the active detection area. However, this approach reasonably measures only a small number of devices and does not provide information about spatial variations across the active area of the panel.

BRIEF DESCRIPTION OF THE INVENTION

Some configurations of the present invention therefore provide a method for monitoring the quality of a manufacturing process for making detector panels that have a plurality of pixels in a two-dimensional array. The method includes, in each detector panel, manufacturing a set of baseline pixels and a set of test pixels. Each test pixel has an electrical component having a geometric dimension varied by an amount sufficient to introduce a measurable variation in a test that measures parameters of pixels that are dependent upon the varied dimension. The method further includes performing the test on the set of baseline pixels and the set of varied pixels, analyzing the results of the test, and adjusting parameters of the manufacturing process in accordance with the analysis.

In other aspects, the invention provides a method for monitoring the quality of a manufacturing process for making detector panels that have a plurality of pixels in a two-dimensional array, and wherein each pixel includes a field effect transistor. The method includes, in each detector panel, manufacturing a set of baseline pixels and a set of test pixels. Each test pixel has an electrical component having a geometric dimension varied by an amount sufficient to introduce a measurable variation in a test that measures parameters of pixels that are dependent upon the varied dimension. In these aspects, manufacturing a set of test pixels includes manufacturing a set of test pixels with dimension of the field effect transistor varied. The test further includes performing the test on the set of baseline pixels and the set of varied pixels, analyzing the results of the test and adjusting parameters of the manufacturing process in accordance with the analysis.

In yet other configurations, the present invention provides a method for monitoring the quality of a manufacturing process for making detector panels having a plurality of pixels in a two-dimensional array, and in which each pixel includes a field effect transistor and a photodiode. The method includes, in each detector panel, manufacturing a set of baseline pixels and a set of test pixels. Each test pixel has an electrical component having a geometric dimension varied by an amount sufficient to introduce a measurable variation in a test that measures parameters of pixels that are dependent upon the varied dimension. In these configurations, manufacturing a set of test pixels includes manufacturing a first subset of test pixels having a geometric dimension of the field effect transistor varied, and manufacturing a second subset of test pixels having a geometric dimension of the photodiode varied. The method further includes performing the test on the set of baseline pixels and the set of varied pixels, analyzing the results of the test, and adjusting parameters of the manufacturing process in accordance with the analysis.

In still other configurations, the present invention provides a detector panel having a two-dimensional pattern comprising baseline pixels and test pixels, wherein said test pixels include pixels having an electrical component that has a single geometric dimension varied with respect to the baseline pixels.

It will be evident that configurations of the present invention are useful for monitoring the production of a flat panel x-ray detector in processes having multiple steps that can affect the final performance of the detector. By introducing variation into individual detector elements, many process steps can be monitored independently as a part of the production process. Configurations of the present invention are also useful for monitoring process variability as well as for monitoring and fixing process failures.

DETAILED DESCRIPTION OF THE INVENTION

Figure 1:
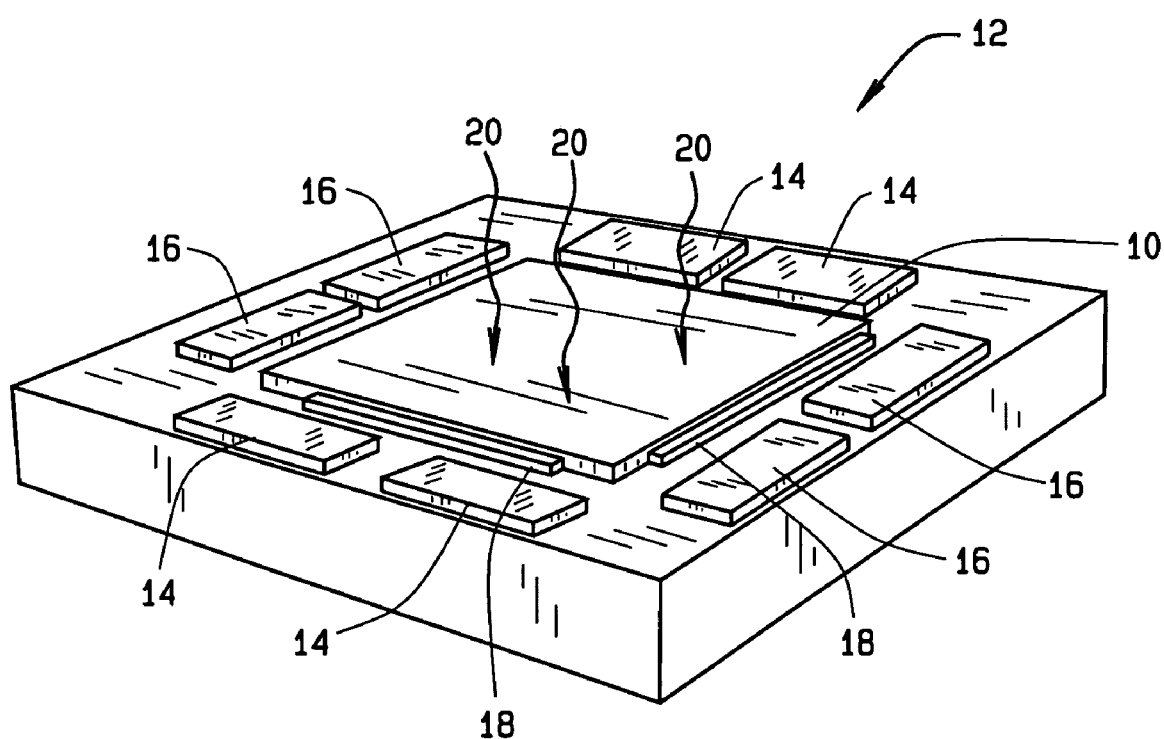
FIG. 1 is a perspective view representative of various display panel configurations of the present invention.

In some configurations of the present invention, designed variability is introduced in the geometry of individual pixels of a pixilated detector. Small changes in device dimension are introduced without degrading overall performance and image quality of the detector. The design variations are used to obtain a spatial map of the quality of one or more individual layers on a panel. The introduced designed variation is useful to monitor the quality of each process step and as for diagnosing problems during performance failure. To simplify interpretation, some configurations of the present invention introduce geometry variations that strongly influence final device performance through one process step. Configurations of the present invention can be generalized to the fabrication of any pixilated detection or display system.

A functioning detector design is used as a baseline for introducing variations into pixels. Layers critical to final device performance are identified. A dimension associated with these layers in the device or which contact the layers is identified. An enlarged or decreased dimension is selected that will have a measurable influence on final performance without creating objectionable artifacts. The modified dimension is inserted into the baseline pixel design, along with other modified pixels. Only the number of pixels in the array fundamentally limits the number of modifications. However, in configurations in which flat panel x-ray detectors are fabricated using optical masks, the number of pixels is limited to the number of devices that can be included on a mask. The group of modified pixel designs is assembled in an array having the same or similar dimensions to the baseline array. The layout of modified pixels is selected in accordance with desired overall image quality as well as the desired spatial extent of variations to be detected. In some configurations in which ordered boundaries of modified pixels are determined to potentially decrease image quality, a randomized pattern of pixel designs is used. Repeat spacing of a group of modified pixels is also useful to limit a minimum spatial extent of an array that can be diagnosed. If a process variation exists with a size smaller than the total number of design variations, it will affect modified pixels within the group differently.

After a detector is fabricated and its performance measured, a set of simple diagnostic images is generated. For each design variation group, the value of a single design variation minus the baseline is related to the local sensitivity of the design parameter. Some configurations form an image for each design variation. The morphology as well as average value of the diagnostic images is compared to previous images. Changes in single layer performance across the panel are thus monitored. If the quality of a layer begins to degrade, dimensional changes to the layer are determined to have a significant effect on final performance. In addition, localized areas of degraded film quality can often be used in configurations of the present invention to trace the cause of the degradation. Configurations of the present invention also yield a spatial image indicative of the quality of each layer.

Thus, some configurations of the present invention provide a method that measures film quality of individual device layers in a pixilated detector array using small geometric variations in the detector array itself. In some configurations and referring to FIG. 1, a pixel array 10 uniformly coated with a scintillator material such as CsI, forms an active sensing area of a flat x-ray detector 12. Detector 12 also includes scan drive electronics 14, data conversion electronics 16, and interconnections 18, which may be of any conventional type known in the art and which need not be described in detail here. (Some of interconnections 18 in FIG. 1 are hidden behind a portion of pixel array 10.)

Figure 2:
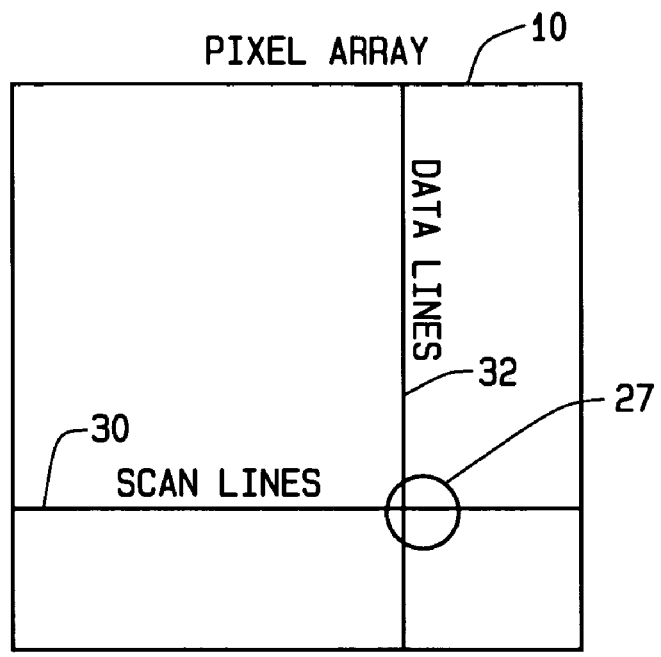
FIG. 2 is a simplified schematic representation of the pixel array configuration of FIG. 1.
Figure 3:
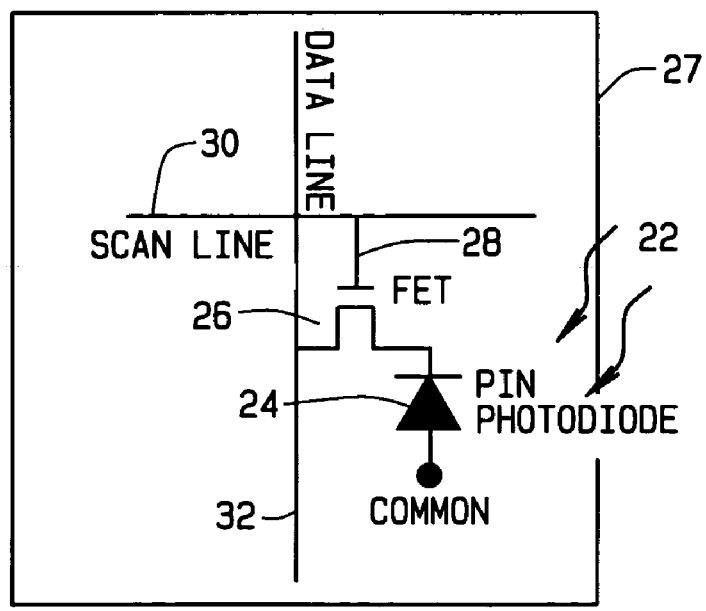
FIG. 3 is a schematic representation of a representative pixel configuration of the pixel array of FIG. 2.

As x-rays 20 strike the scintillator material of pixel array 10, visible light is created that is subsequently absorbed by diodes (not shown in FIG. 1) of pixel array 10. Referring to FIGS. 2 and 3, visible light 22 strikes PIN photodiode 24 of a pixel 27 and creates a charge stored by the photodiode pixel element while FET switch 26 is off (nonconducting). The pixel is read off by applying a voltage to gate 28 of FET 26 via one of a plurality of conductive scan lines 30 that are driven by scan drive electronics 14. The accumulated charge passes through a conductive data line 32, which is one of a plurality of such data lines 32. The charge is converted to digital information by data conversion electronics 16. Only one scan line 30 and one data line 32 are shown in FIGS. 2 and 3. However, a pixel array 10 will have a plurality of each, depending upon the number and arrangement of pixels 27 in pixel array 10. For example, one configuration of pixel array 10 provides 1024×1024 pixels, with a corresponding number of scan lines and data lines.

Figure 4:
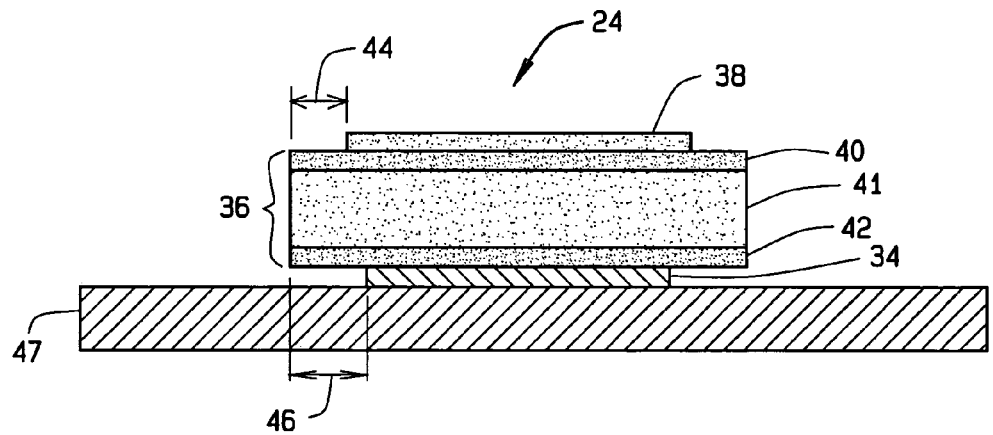
FIG. 4 is a side cross-sectional view representative of various configuration of PIN photodiodes useful as the PIN photodiode in FIG. 3.

In some configurations of the present invention and referring to FIG. 4, pixel monitoring is accomplished by a process that includes adding small geometric variations onto neighboring pixels 27, specifically, PIN diodes 24. More particularly, diode 24 is fabricated by depositing a metal contact 34, PIN diode material 36, and a top contact 38, all over a substrate 47. PIN diode material 36 comprises a $p^+$ amorphous silicon resistive layer 40, an intrinsic amorphous silicon layer 41, and an $n^-$ amorphous silicon layer 42. For lithographic reasons, P layer 40 and N layer 42 are not completely covered by the conductive material comprising conductive layers 38 and 34, respectively, which may themselves comprise ITO or metal or other suitable conductor. Because P layer 40 and N layer 42 are resistive, charge that has been stored in capacitance between bottom gap regions 46 and layer 24 of diode 24 limits the readout speed of diode 24 in pixel 27. Additionally, as gaps 44 and 46 increase in size, the performance of the pixel 27 formed by diode 24 degrades. Thus, in various configurations of the present invention, the process quality of P layer 40 and N layer 42 is continually monitored and manufacturing conditions are changed if the quality of layers 40 and 42 degrade, as measured by the degradation of diode 24. (Although not shown in FIG. 4, passivation layers are also part of the diode structure, as is known in the art, as is a contact layer over a portion of conductive layer 38. Also, gap 44 and gap 46 may be, but need not necessarily be equal around all four edges of a rectangular diode 24, in configurations using rectangular geometry.)

Although not shown in FIG. 4, the channel length of FET 26 is used in some configurations of the present invention to monitor pixel quality. Various configurations of the present invention utilize one or more dimensions in pixel 27 in various combinations to monitor performance of array 10 and thus the manufacturing quality of panel 12.

Figure 5:
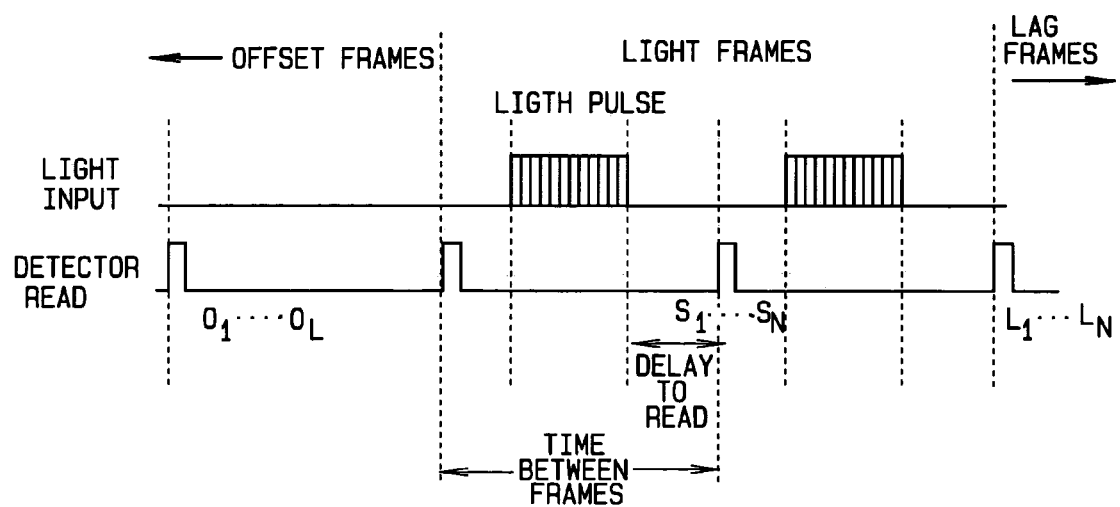
FIG. 5 is a timing diagram representative of a lag test useful in various configurations of the present invention.

A measurable performance factor affected by the resistivity of P layer 40 and N layer 42 is lag, tested before or after pixel area 10 has scintillator material deposited thereon. Lag is measured under test conditions by applying visible light (or X-rays if the scintillator has been deposited) to panel 12, reading a signal from photodiodes 24 in pixel area 10 in a plurality of frames, and recording the fraction of signal that is read out in frames following the frame in which, ideally, the light signal should have been completely output. Thus, in some configurations and referring to timing diagram 100 of FIG. 5, a light signals from a set of offset frames ($O_1 \ldots O_L$) is collected without light exposure to pixel area 10. A series of light frames ($S_1 \ldots S_M$) follow, in sufficient quantity to allow a signal read from detector 12 to equilibrate. Next, a set of lag frames ($L_1 \ldots L_N$) is acquired following light exposure. The lag signal is taken as:

$$L_1 = \frac{(L_1 - \langle O_i \rangle)}{(S_M - \langle O_i \rangle)}$$

where the offset frames have been averaged. Lag for subsequent frames can also be measured, however, the quality of P layer 40 and N layer 42 strongly affects the $L_1$ lag.

In configurations of the present invention, a slight column-by-column modulation in top and bottom gaps 44 and 46 is added to a pixel array 10 to monitor the quality of layers contained in detectors 12, and a variation in FET channel length is also used. For modified pixels 24 in array 10, either top gap 44, bottom gap 46, or the FET channel length increases slightly. The change is kept sufficiently small so that only a slight shift in the performance of detector 12 occurs under normal operating conditions. For example, in some configurations, the increased lag introduced by varying the mask dimension for the FET channel length from 2 microns to 2.35 microns is 0.4%. The increased lag introduced by varying the mask dimension of bottom gap 46 from 7.5 microns to 8.5 microns is 0.11%, and by varying the mask dimension of top gap 44 from 2 microns to 2.5 microns is less than about 0.1%. Under test conditions, the pixel monitor image of lag performance is modulated by the change in size of gap 44 or 46 or the FET channel length. To form an image of film quality for N layer 42, for example, some configurations of the present invention determine a difference between the lag performance of top gap 44 modified pixels 27 and neighboring pixel 27 elements.

Figure 6:
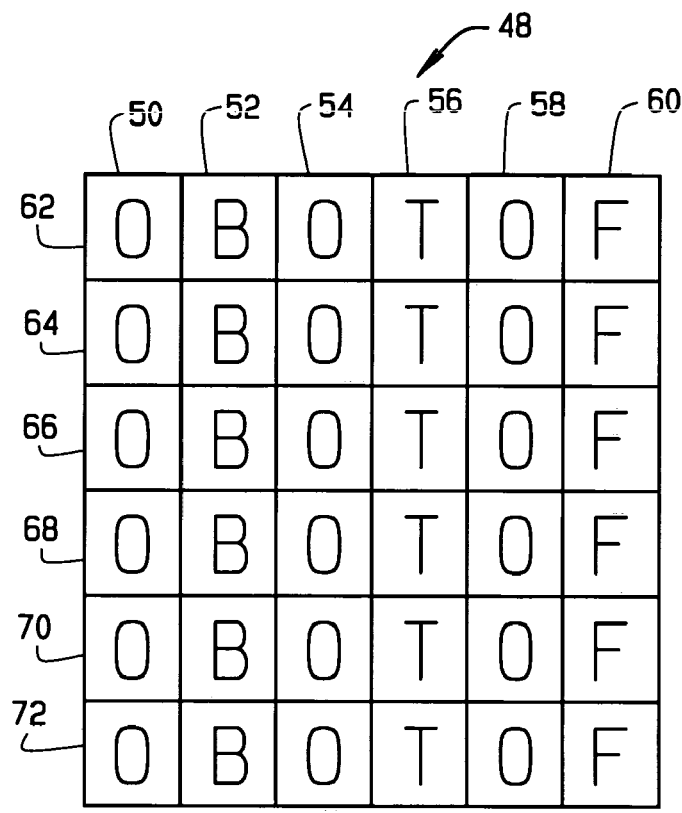
FIG. 6 is a diagram showing a representative stepping pattern useful in various configurations of the present invention for pixel arrays.

For example in some configurations, within each column of array 10, pixels 27 have identical photodiodes 24 and FET channel lengths, but each row contains a repeating variation of photodiodes 24 and FET channel lengths. An example of such a configuration is represented by pattern 48 of FIG. 6, which can be stepped horizontally and vertically to form a pixel array 10. FIG. 6 represents an arrangement of pixels 27 represented by baseline pixels (0), pixels in which bottom gap 46 is modified (B), pixels in which top gap 44 is modified (T) and pixels in which FET 26 channel length is modified (F). In pattern 48, columns 50, 54, and 58 each contain pixels having baseline photodiodes 24 and baseline FET channel lengths. Column 52 has pixels in which only bottom gap 46 is varied. Column 56 has pixels in which only top gap 44 is varied. Column 60 has pixels in which only FET 26 channel length is varied. Rows 62, 64, 66, 68, 70, and 72 are identical to one another. Pattern 48 is representative of the entire array 10, in that the pattern of columns and rows is repeated throughout array 10. Thus, each baseline column is adjacent a column having a single varied dimension. Pattern 48 is only representative of suitable patterns for pixel array 10. Another example (but not the only other example) of a suitable pattern for pixel array 10 is formed by a stepping pattern comprising only columns 50, 52, 54 and 56, and rows 62, 64, 66, and 68.

Figure 7:
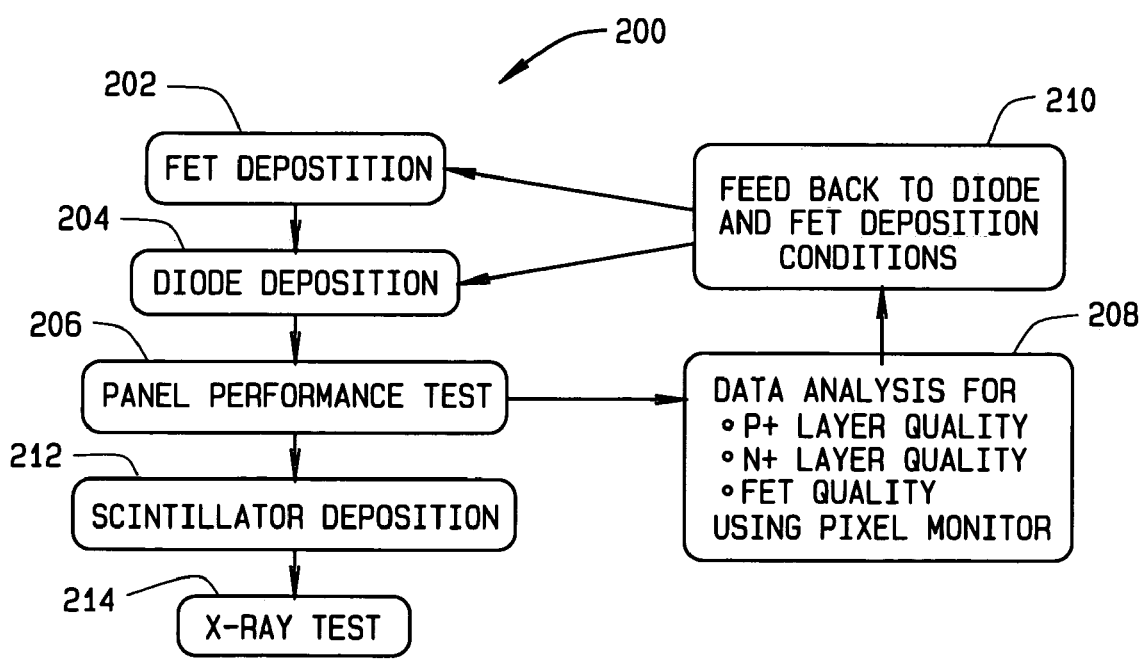
FIG. 7 is a flow chart representative of various process configurations of the present invention.

Thus, in some configurations of the present invention, and referring to flow chart 200 of FIG. 7, FETs 26 are deposited on substrate 47 at 202, and diodes 24 are deposited on substrate 47 at 204. After this deposition, panel 12 is performance tested for lag at 206 and the data obtained is analyzed for quality at 208. If necessary, process quality adjustments are made at 210 to diode deposition process 204 and/or FET deposition process 202 for the next panel produced. After the panel performance test, scintillator material is deposited on array 10 at 212 and an x-ray test of the panel is performed at 214. In configurations in which panel 12 is a visible light detection panel rather than an x-ray detection panel, scintillator deposition 212 and x-ray test 214 are not performed.

More specifically, panel performance test for lag at 206 in some configurations of the present invention comprises performing the light test described above in conjunction with FIG. 5. For each design variation (e.g., for top gap 44 variation and for bottom gap 46 variation), the local sensitivity to that variation is determined. This comparison is performed by comparing lag data obtained from pixels 27 in the baseline columns (such as 50 and 52) with lag data obtained from adjacent pixels 27 in adjacent columns. Because of the arrangement of the columns, the sensitivity with respect to a single parameter is obtained (e.g., column 52 for bottom gap 46 sensitivity or column 56 for top gap 44 sensitivity).

For example, in some configurations, the measured pixel 27 outputs of a baseline lag frame image (containing only baseline columns) is subtracted from measured pixel 27 outputs of a lag frame image obtained at the same time containing only bottom gap 46 varied columns. Each pixel 27 of the bottom gap 46 varied column image has an adjacent pixel 27 of a baseline column subtracted from it. The average pixel value of the resulting image corresponds to a sensitivity to variations in bottom gap 46. Correspondingly, the baseline lag frame image comparison to the top gap 44 varied columns is used to obtain sensitivity to variations in top gap 44. The morphology of the images resulting from the subtraction of a baseline image from a single-parameter varied image as well as their average pixel values can be compared to corresponding images from previously produced panels 12. An increased sensitivity in one or more localized regions of a single panel that is observed in a difference image for a single parameter represents a localized decline in quality of the layer corresponding to the varied parameter. A correction can thus be made to that layer to make the layer more uniform in quality. On the other hand, if the overall quality of a layer is degraded, the average sensitivity to dimensional changes in that layer will increase. In this case, a correction can be made to the process that affects the entire layer. The morphology of a different image from a lag test is used in some configurations of the invention, wherein non-uniformity of the image is also an indication of uniformity that can be corrected in the manufacturing process.

In the case of PIN diodes such as diode 24, the control of resistivity of P-type and N-type films (used for layers 40 and 42, respectively) is mainly through concentration of the dopant material. In the case of chemical vapor deposition, this concentration corresponds to the partial pressure of dopant feed gas. Other factors can affect resistivity as well, including indirect effects. These factors could be controlled by feedback as well, and include deposition power, temperature, gas feed rate, and electrode gap. The present invention measures the contribution of a layer or layers of bulk film in an active device to a performance quantity of interest for that device that can be related back to the resistivity of the layer. For performance optimization, in some configurations of the present invention, the monitor signal (e.g., lag) vs. dopant concentration is first mapped out to choose an optimum (or nearly optimum) operating point. As the process continues to run, analysis of the monitor signal is used to ensure continuing performance and stability.

Thus, some configurations of the present invention provide a method for monitoring and/or controlling the quality of a manufacturing process for making detector panels 12 comprising a plurality of pixels 27 in a two-dimensional array 10. The method includes, in each detector panel 12, manufacturing a set of baseline pixels and a set of test pixels. Each test pixel comprises an electrical component (e.g., FET 28 or photodiode 24) having a geometric dimension (e.g., a channel length of FET 28 or a top gap 44 or bottom gap 46 of photodiode 24) varied. The amount of variation is sufficient to introduce a measurable variation in a test that measures parameters of pixels that are dependent upon the varied dimension. A test is then performed on the set of baseline pixels and the set of varied pixels, such as illuminating the panel in a manner described above with respect to FIG. 6. The results of the test are analyzed, and parameters of the manufacturing process are adjusted in accordance with the results of the analysis.

In some of these configurations, the test includes illuminating both the set of baseline pixels and the set of varied pixels simultaneously, and the parameter dependent upon the varied dimension is lag.

Also in some configurations, each pixel 27 includes a photodiode 24, and the varied geometric dimension in the test pixels is a dimension (e.g., top gap 44 or bottom gap 46) of a layer of the photodiode. In some configurations, the manufacturing includes manufacturing a first subset of test pixels having a first geometric dimension varied (e.g., top gap 44) and a second subset of test pixels having a second, different geometric dimension varied (e.g., bottom gap 46). In various configurations, each baseline pixel is manufactured adjacent a test pixel and vice versa, and in some of these configurations, rows or columns of pixels alternate between rows or columns of baseline pixels (50, 54) and rows or columns of test pixels (52, 56). (Because a row becomes a column and vice versa when an array is rotated 90 degrees, whether rows alternate or columns alternate depends upon a reference orientation chosen for describing the array.) In many configurations, the variation of the first geometric dimension will be the same for every pixel 27 in which the first geometric dimension is varied, and the second geometric variation will be the same for every pixel 27 in which the second geometric dimension is varied. The number of different values for a given geometric dimension can be as many as desired, but usually only two values are necessary (a baseline dimension and a second value). This is because for small variations in dimensions, the changes in performance vary nearly linearly with the dimensional variation.

Some configurations have test pixels 27 having photodiodes 24 with a first dimension varied (e.g., top gap 44), test pixels 27 having photodiodes 24 with a second dimension varied (e.g., bottom gap 46), and test pixels 27 with an FET dimension varied (e.g., FET channel length). Each test pixel 27 in some of these configurations has only one of these dimensions varied. Moreover, in some configurations, the same amount of variation is applied to each test pixel having the same dimension varied, although the variations of the different dimensions that are varied may themselves be different. In some configurations, every other row or column is a row or column of baseline pixels. Of the remaining rows or columns, each different dimensional variation is repeated in every third row or column.

In some configurations, a test is performed on a single manufactured detector panel, and analyzing the results of the test includes analyzing the morphology of a difference image. Also, in some configurations, tests are performed on different manufactured detector panels, and analyzing the results of the test includes analyzing a change in average sensitivity between different detector panels, and/or analyzing a change in morphology of difference images.

Some configurations of the present invention provide a detector panel 12 having alternating rows or columns of baseline pixels (50, 54) and test pixels (52, 56). Each row or column of test pixels includes pixels having an electrical component having a single geometric dimension (e.g., FET 28 channel length, or photodiode 24 top gap 44 or bottom gap 46) varied with respect to the baseline pixels. Some configurations of these detectors have rows or columns of test pixels having geometric dimensions of photodiode 24 varied with respect to the baseline pixels. Also, some configurations of these detectors have rows or columns of test pixels having geometric dimensions of FET 28 varied with respect to the baseline pixels. Some configurations have rows or columns of test pixels in which geometric dimensions of photodiode 24 are varied with respect to the baseline pixels and also rows or columns of test pixels having geometric dimensions of FET 28 varied with respect to the baseline pixels.

The use of designed pixel variations in configurations of the present invention enables a continual in-situ monitor of detector production. The film quality of multiple layers can be measured on a single panel and problems that arise in production can be quickly isolated. In addition, spatial and temporal variability of individual process steps can be measured. The method involves very little or no extra cost to detector manufactures, and does not degrade image quality. Moreover, methods of the present invention can provide on-panel continual monitoring of film quality for flat panel x-ray detectors, and multiple layers on a single panel can be measured independently. The method can be incorporated into existing baseline designs with no additional devices or equipment. Diagnostic images made with the panel can be used to diagnose spatial variation across the panel. Moreover, configurations of panels described herein are useful as either light or, if a scintillator is included, x-ray detectors, including flat panel x-ray detectors.

While the invention has been described in terms of various specific embodiments, those skilled in the art will recognize that the invention can be practiced with modification within the spirit and scope of the claims.

What is claimed is:

1. A method for monitoring the quality of a manufacturing process for making detector panels comprising a plurality of pixels in a two-dimensional array, said method comprising:
in each detector panel, manufacturing a set of baseline pixels and a set of test pixels wherein each test pixel comprises an electrical component having a geometric dimension varied by an amount sufficient to introduce a measurable variation in a test to measure parameters of pixels dependent upon the varied dimension;
performing the test on the set of baseline pixels and the set of varied pixels;
analyzing the results of the test; and
adjusting parameters of the manufacturing process in accordance with said analysis.

2. A method in accordance with claim 1 wherein performing the test to measure a parameter dependent upon the varied dimension comprises illuminating the set of baseline pixels and the set of varied pixels simultaneously, and the parameter dependent upon the varied dimension is lag.

3. A method in accordance with claim 1 wherein each pixel includes a photodiode, and the varied geometric dimension in the test pixels is a dimension of a layer of the photodiode.

4. A method in accordance with claim 3 wherein manufacturing a set of baseline pixels and a set of test pixels comprises manufacturing a first subset of test pixels having a first geometric dimension varied, and manufacturing a second subset of test pixels having a second, different geometric dimension varied.

5. A method in accordance with claim 3 wherein each baseline pixel is adjacent a test pixel and vice versa.

6. A method in accordance with claim 5 wherein manufacturing a set of baseline pixels and a set of test pixels comprises manufacturing a first subset of test pixels having a first geometric dimension varied, and a second subset of test pixels having a second, different geometric dimension varied.

7. A method in accordance with claim 5 wherein rows or columns alternate between rows or columns of baseline pixels and rows or columns of test pixels.

8. A method in accordance with claim 7 wherein the rows or columns of test pixels alternate between rows or columns of test pixels having the first geometric dimension varied, and rows or columns of test pixels having the second geometric dimension varied.

9. A method in accordance with claim 8 wherein the first geometric dimension variation is the same amount for all pixels having the first geometric dimension varied, and the second geometric dimension variation is the same for all pixels having the second geometric dimension varied.

10. A method in accordance with claim 1 wherein performing the test on the set of baseline pixels and the set of varied pixels comprises performing the test on a single detector panel; and analyzing the results of the test comprises analyzing morphology of a difference image.

11. A method in accordance with claim 1 wherein performing the test on a set of baseline pixels and the set of varied pixels comprises performing the test on different detector panels, and analyzing the results of the test comprises analyzing a change in average sensitivity between different detector panels.

12. A method for monitoring the quality of a manufacturing process for making detector panels comprising a plurality of pixels in a two-dimensional array, and wherein each pixel includes a field effect transistor, said method comprising:

in each detector panel, manufacturing a set of baseline pixels and a set of test pixels wherein each test pixel has an electrical component having a geometric dimension varied by an amount sufficient to introduce a measurable variation in a test to measure parameters of pixels dependent upon the varied dimension, wherein manufacturing a set of test pixels comprises manufacturing a set of test pixels with dimension of the field effect transistor varied;

performing the test on the set of baseline pixels and the set of varied pixels;

analyzing the results of the test; and adjusting parameters of the manufacturing process in accordance with said analysis.

13. A method in accordance with claim 12 wherein the varied dimension is FET channel length.

14. A method in accordance with claim 13 wherein performing the test on the set of baseline pixels and the set of varied pixels comprises performing the test on a single detector panel; and analyzing the results of the test comprises analyzing morphology of a difference image.

15. A method in accordance with claim 13 wherein performing the test on a set of baseline pixels and the set of varied pixels comprises performing the test on different detector panels, and analyzing the results of the test comprises analyzing a change in average sensitivity between different detector panels.

16. A method for monitoring the quality of a manufacturing process for making detector panels comprising a plurality of pixels in a two-dimensional array, wherein each pixel includes a field effect transistor and a photodiode, said method comprising:

in each detector panel, manufacturing a set of baseline pixels and a set of test pixels wherein each test pixel has an electrical component having a geometric dimension varied by an amount sufficient to introduce a measurable variation in a test to measure parameters of pixels dependent upon the varied dimension, wherein manufacturing a set of test pixels comprises manufacturing a first subset of test pixels having a geometric dimension of the field effect transistor varied, and manufacturing a second subset of test pixels having a geometric dimension of the photodiode varied;

performing the test on the set of baseline pixels and the set of varied pixels;

analyzing the results of the test; and adjusting parameters of the manufacturing process in accordance with said analysis.

17. A method in accordance with claim 16 wherein manufacturing a second subset of test pixels having a geometric dimension varies comprises manufacturing a first portion of the second subset of test pixels with a first geometric dimension varied and a second portion of the second subset of test pixels with a second geometric dimension varied.

18. A method in accordance with claim 17 wherein the variation of the geometric dimension of the field effect transistor is the same for all pixels having the geometric dimension of the field effect transistor varied, the first geometric dimension variation is the same amount for all pixels having the first geometric dimension of the photodiode varied, and the second geometric dimension variation is the same for all pixels having the second geometric dimension of the photodiode varied.

19. A method in accordance with claim 18 wherein performing the test to measure a parameter dependent upon the varied dimension comprises illuminating the set of baseline pixels and the set of varied pixels simultaneously, and the parameter dependent upon the varied dimension is lag.

20. A method in accordance with claim 16 wherein every other row or column is a row or column of baseline pixels, and of the remaining rows or columns, every third row or column is a row or column of the first subset of test pixels, every third row or column is a row or column of the first portion of the second subset of test pixels, and every third row or column is a row or column of the second portion of the second subset of test pixels.

21. A method in accordance with claim 16 wherein performing the test on the set of baseline pixels and the set of varied pixels comprises performing the test on a single detector panel; and analyzing the results of the test comprises analyzing morphology of a difference image.

22. A method in accordance with claim 16 wherein performing the test on a set of baseline pixels and the set of varied pixels comprises performing the test on different detector panels, and analyzing the results of the test comprises analyzing a change in average sensitivity between different detector panels.

* * * * *